(12) United States Patent
Lee et al.

(10) Patent No.: US 12,158,494 B2
(45) Date of Patent: Dec. 3, 2024

(54) AUTOMATIC TEST SYSTEM AND AUTOMATIC TEST METHOD FOR INTEGRATED-CIRCUIT DEVICES

(71) Applicant: Kingston Digital, Inc., Fountain Valley, CA (US)

(72) Inventors: Chao-Kun Lee, Hsinchu (TW); Chih-Hsiang Hsiao, Hsinchu (TW); Cheng-En Yu, Hsinchu (TW)

(73) Assignee: Kingston Digital, Inc., Fountain Valley, CA (US)

( * ) Notice: Subject to any disclaimer, the term of this patent is extended or adjusted under 35 U.S.C. 154(b) by 149 days.

(21) Appl. No.: 18/071,611

(22) Filed: Nov. 29, 2022

(65) Prior Publication Data

US 2024/0003963 A1     Jan. 4, 2024

(30) Foreign Application Priority Data

Jun. 30, 2022 (TW) .................................. 111124450

(51) Int. Cl.
    *G01R 31/28*     (2006.01)
    *B65D 19/00*     (2006.01)
    (Continued)

(52) U.S. Cl.
    CPC ..... *G01R 31/2834* (2013.01); *G01R 31/2868* (2013.01); *G01R 31/2893* (2013.01);
    (Continued)

(58) Field of Classification Search
    CPC ............ G01R 31/2834; G01R 31/2893; G01R 31/2868; G01R 31/31718; B65D 19/0036; B65D 19/38
    (Continued)

(56) References Cited

U.S. PATENT DOCUMENTS

2005/0012498 A1    1/2005   Lee et al.
2008/0038098 A1    2/2008   Ito et al.
                 (Continued)

FOREIGN PATENT DOCUMENTS

TW        M403656 U1    5/2011
WO    2007053240 A2    5/2007
WO    2018187668 A1   10/2018

OTHER PUBLICATIONS

TW M403656 Machine Translation, May 11, 2011 (Year: 2011).*

(Continued)

*Primary Examiner* — Raul J Rios Russo

(74) *Attorney, Agent, or Firm* — Skaar Ulbrich Macari, P.A.

(57) ABSTRACT

In an automatic test system, a test computer of a kind of test equipment communicates with a loading-and-unloading computer of a kind of loading-and-unloading equipment. The loading-and-unloading equipment automatically loads a plurality of target devices on a plurality of test carriers according to the state of the test equipment, and the test equipment automatically tests the target devices loaded on the test carriers according to the state of the loading-and-unloading equipment. In addition, after the test is completed, the loading-and-unloading equipment automatically unloads the tested target devices from the test carriers, and automatically sorts the tested target devices according to the test results generated by the test equipment.

6 Claims, 5 Drawing Sheets

(51) Int. Cl.
*B65D 19/38* (2006.01)
*G01R 31/317* (2006.01)

(52) U.S. Cl.
CPC .... *G01R 31/31718* (2013.01); *B65D 19/0036* (2013.01); *B65D 19/38* (2013.01)

(58) Field of Classification Search
USPC .................................................. 324/762.01
See application file for complete search history.

(56) References Cited

U.S. PATENT DOCUMENTS

| | | |
|---|---|---|
| 2009/0058439 A1 | 3/2009 | Suzuki et al. |
| 2011/0000829 A1 | 1/2011 | Linde et al. |
| 2013/0200915 A1* | 8/2013 | Panagas ............. G01R 31/2893 324/757.01 |
| 2017/0102427 A1 | 4/2017 | Lee et al. |
| 2018/0313890 A1* | 11/2018 | Wolff ................. G01R 31/2893 |
| 2019/0023502 A1 | 1/2019 | Sun et al. |
| 2019/0064252 A1* | 2/2019 | Bowyer ................. G01R 31/27 |
| 2020/0379033 A1 | 12/2020 | Chang |
| 2022/0187360 A1 | 6/2022 | Lee |

OTHER PUBLICATIONS

Combined Search and Examination Report to the corresponding United Kingdom Patent Application rendered by the UK Intellectual Property Office (UKIPO) on Jun. 2, 2023, 7 pages.

Office Action to the corresponding Taiwan Patent Application rendered by the Taiwan Intellectual Property Office (TIPO) on Apr. 20, 2023, 14 pages (including summary English translation).

* cited by examiner

AUTOMATIC TEST SYSTEM AND AUTOMATIC TEST METHOD FOR INTEGRATED-CIRCUIT DEVICES

PRIORITY

This application claims priority to Taiwan Patent Application No. 111124450, filed on Jun. 30, 2022, which is incorporated herein by reference in its entirety.

FIELD

The present disclosure relates to an automatic test system. More specifically, the present disclosure relates to an automatic test system capable of automatically loading/unloading, testing, and sorting integrated-circuit (IC) devices.

BACKGROUND

Conventional test systems for IC devices rely upon an operator to install/load a target device (i.e., a device under test) such as a memory, CPU or the like) on a test carrier (e.g., a motherboard) and then to operate test equipment to execute a test program for the target device. The operator is also relied on to remove/unload the tested target devices from the test carriers after the completion of the test program, and according to the test results generated by the test equipment, to determine whether the tested target device comply with a preset standard and categorize the tested target devices into proper areas. Such test systems not only have a high error rate, but is also inefficient in operation. In view of this, there is an urgent need in the art for improving the operation efficiency of testing IC devices.

SUMMARY

An automatic test system in certain embodiments may comprise test equipment and loading-and-unloading equipment. The test equipment may comprise a test computer, the loading-and-unloading equipment may comprise a loading-and-unloading computer, and the loading-and-unloading computer is capable of communicating with the test computer. The loading-and-unloading equipment may be configured to automatically load a plurality of target devices on a plurality of test carriers according to a state of the test equipment. The test equipment may be configured to automatically test the target devices loaded on the test carriers according to a state of the loading-and-unloading equipment. In addition, the loading-and-unloading equipment may be configured to automatically unload the tested target devices from the test carriers, and automatically sort the tested target devices according to test results generated by the test equipment.

An automatic test method in certain embodiments may comprise the steps of:
 loading automatically, by loading-and-unloading equipment, a plurality of target devices on a plurality of test carriers according to a state of test equipment, wherein a test computer of the test equipment is capable of communicating with a loading-and-unloading computer of the loading-and-unloading equipment;
 testing automatically, by the test equipment, the target devices loaded on the test carriers according to a state of the loading-and-unloading equipment;
 unloading automatically, by the loading-and-unloading equipment, the tested target devices from the test carriers; and
 sorting automatically, by the loading-and-unloading equipment, the tested target devices according to test results generated by the test equipment.

As described above, the automatic test system and automatic test method provided by certain embodiments can automatically install/load the target device (i.e., the device under test) on the test carrier to facilitate subsequent testing, and can also automatically remove/unload the tested target device from the test carrier and sort the tested target device according to the test results after the test is completed. The loading-and-unloading equipment and the test equipment can carry out automatic loading/unloading and testing procedures, respectively, and can thus improve their work efficiency. Moreover, the problem that causes the overall test efficiency to drop due to the two kinds of equipment being unable to grasp each other's work progress can be avoided, since the loading-and-unloading equipment and the test equipment are capable of cooperating with each other. Therefore, the automatic test system and automatic test method provided by the present disclosure are indeed capable of improving the above-mentioned technical problems of the conventional test systems.

DETAILED DESCRIPTION

Figure 1A:
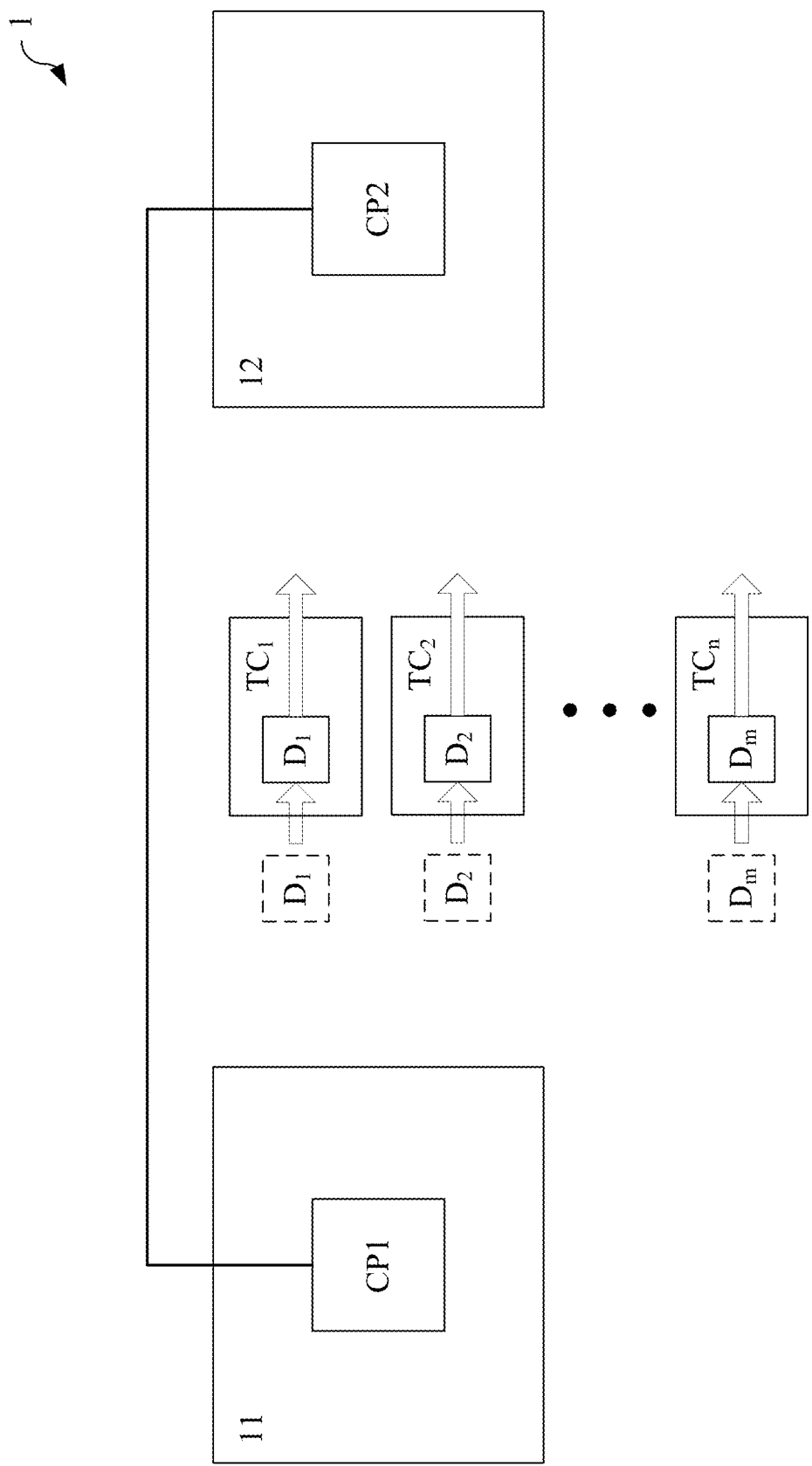
FIG. 1A depicts a schematic view of an automatic test system according to one or more embodiments of the present disclosure.

The example embodiments described below are not intended to limit the invention to any particular environment, application, embodiment, structure, process, or steps described in these example embodiments. In the drawings, elements unrelated to the present invention are not shown. The dimensions and dimensional relationships of individual elements in the figures are illustrative examples only, and are not intended to limit the invention. In the following description, the same (or similar) reference numerals may correspond to the same (or similar) elements unless otherwise specified.

The terms used herein are for the purpose of describing the embodiments only and are not intended to limit the invention. The singular form "a" is intended to include the plural form as well, unless the context clearly dictates otherwise. The terms "comprise", "include" and the like designate the existence of the stated roles, integers, steps, operations and/or elements, but do not exclude the existence or additions of one or more other roles, integers, steps, operations, elements and/or combinations thereof. The term "and/or" includes any and all combinations of one or more of the associated listed items. Although the terms "first", "second", "third", etc. may be used herein to describe various elements, these elements should not be limited by these terms. These terms are only used to distinguish one element from another. Thus, for example, a first element described below could also be referred to as a second element without departing from the spirit and scope of the present invention.

FIG. 1A depicts a schematic view of an automatic test system according to one or more embodiments of the present disclosure. The contents shown in FIG. 1A are only for easily illustrating the embodiments, instead of limiting the scope of the present disclosure. Please refer to FIG. 1A. An automatic test system 1 may include a kind of loading-and-unloading equipment 11 and a kind of test equipment 12, and the work field of the loading-and-unloading equipment 11 and the work field of the test equipment 12 may overlap. The loading-and-unloading equipment 11 may comprise a loading-and-unloading computer CP1, the test equipment 12 may comprise a test computer CP2, and the loading-and-unloading computer CP1 and the test computer CP2 can communicate with each other. More specifically, the loading-and-unloading computer CP1 and the test computer CP2 may each comprise a transceiver for performing a wired or wireless communication. Taking wireless communication as an example, the transceivers may comprise, but are not limited to, an antenna, an amplifier, a modulator, a demodulator, a detector, an analog-to-digital converter, a digital-to-analog converter, or other communication elements. As for wired communication, the transceivers may be, for example but not limited to, a gigabit Ethernet transceiver, a gigabit Ethernet interface converter (GBIC), a small form-factor pluggable (SFP) transceiver, a ten-gigabit small form-factor pluggable (XFP) transceiver, or the like.

The loading-and-unloading equipment 11 may obtain the status (e.g., idle/standby, full load, half load, etc.) of the test equipment 12 in real time through the communication between the loading-and-unloading computer CP1 and the test computer CP2, and may automatically load one or more of the target devices $D_1$-$D_m$ (before they are tested) on one or more test carriers $TC_1$-$TC_n$ or automatically unload one or more of the target devices $D_1$-$D_m$ (after they are tested) from the test carriers $TC_1$-$TC_n$ according to the state of the test equipment 12. A test carrier may carry only a single target device in some embodiments. However, it is also feasible to install/load multiple target devices on a single test carrier in some other embodiments. In some embodiments, each of the test carriers $TC_1$-$TC_n$ may be a motherboard, and each of the target devices $D_1$-$D_m$ may be an integrated circuit device such as a memory, a CPU, a graphics card, a sound card, a solid-state disk (SSD), or a non-solid-state hard disk. The loading-and-unloading apparatus 11 may comprise at least one robotic arm or other loading and unloading tools for loading the target devices $D_1$-$D_m$ for test or unloading the target devices $D_1$-$D_m$ after they are tested.

The test equipment 12 may also obtain the status (e.g., idle/standby, full load, half load, etc.) of the loading-and-unloading equipment 11 in real time through the communication between the loading-and-unloading computer CP1 and the test computer CP2, and may automatically test the target devices $D_1$-$D_m$ installed/loaded on the test carriers $TC_1$-$TC_n$ according to the state of the loading-and-unloading equipment 11, and generate corresponding test results after the test is completed. The test results may be, for example, whether each target device complies with a preset test standard.

Depending on different test purposes, the test equipment 12 may comprise different test elements for performing tests of various items on the target devices $D1$-$D_m$. For example, if the heat dissipation capability and/or the heat resistance of the target devices $D_1$-$D_m$ during operation is to be tested, the test equipment 12 may include, for example, a heating element, a temperature sensing element, etc. For another example, if the conductivity of the target devices $D_1$-$D_m$ is to be tested, the test equipment 12 may include a probe, an electric meter, and/or other components related to current measurement.

After the test equipment 12 completes the test, the loading-and-unloading equipment 11 may also automatically unload the tested target devices $D_1$-$D_m$ from the test carriers $TC_1$-$TC_n$, and automatically sort the tested target devices $D_1$-$D_m$. The number of categories for sorting may be preset according to test requirements. For example, in some embodiments, the categories may include: "meet the test standard" and "not meet the test standard". For another example, in some embodiments, the categories may include: "meet the test standard", "not meet the test standard", and "unable to determine".

Figure 1B:
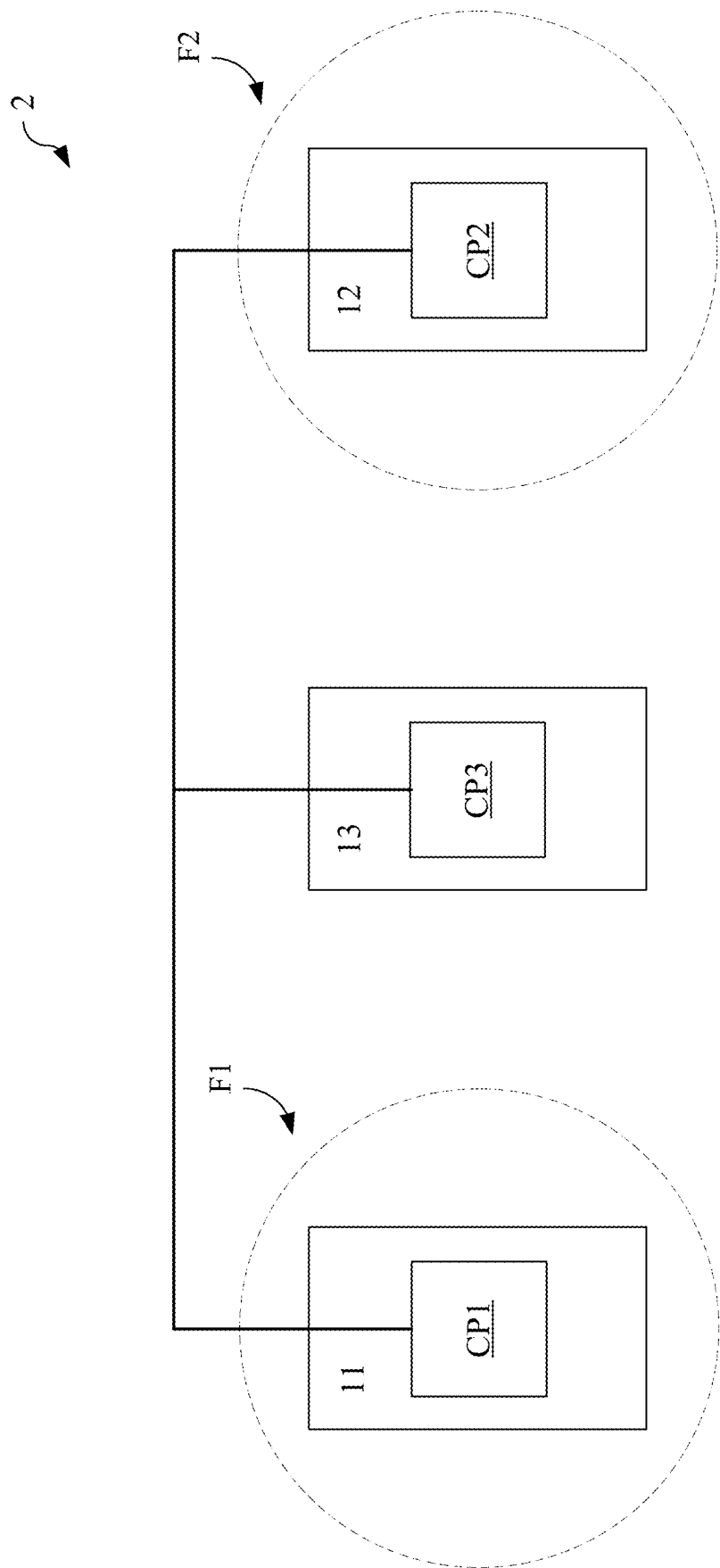
FIG. 1B depicts a schematic view of an automatic test system according to one or more other embodiments of the present disclosure.

FIG. 1B depicts a schematic view of an automatic test system according to one or more other embodiments of the present disclosure. The contents shown in FIG. 1B are only for easily illustrating the embodiments, instead of limiting the scope of the present disclosure. Please refer to FIG. 1B. An automatic test system 2 may include loading-and-unloading equipment 11, test equipment 12 and transportation equipment 13, and in the embodiments of the automatic test system 2, the work field of the loading-and-unloading equipment 11 and the work field of the test equipment 12 may not overlap. Since the work field F1 of the loading-and-unloading equipment 11 does not overlap with the work field F2 of the test equipment 12 (e.g., the loading-and-unloading equipment 11 and the test equipment 12 being separated from each other by several meters), the transportation equipment 13 is required to assist in moving the test carriers $TC_1$-$TC_n$ between the loading-and-unloading equipment 11 and the test equipment 12 so that the loading-and-unloading equipment 11 can load or unload the target devices $D_1$-$D_m$, and the test equipment 12 can test the target devices $D_1$-$D_m$. In some embodiments, when the two work fields F1 and F2 are not so far apart, the on-site operators may also assist in moving the test carriers $TC_1$-$TC_n$ between the loading-and-unloading equipment 11 and the test equipment 12. The transportation equipment 13 may include a transportation computer CP3, and the transportation computer CP3 may include a wired or wireless transceiver for communicating with the test computer CP2 and the loading-and-unloading computer CP1.

Figure 2:
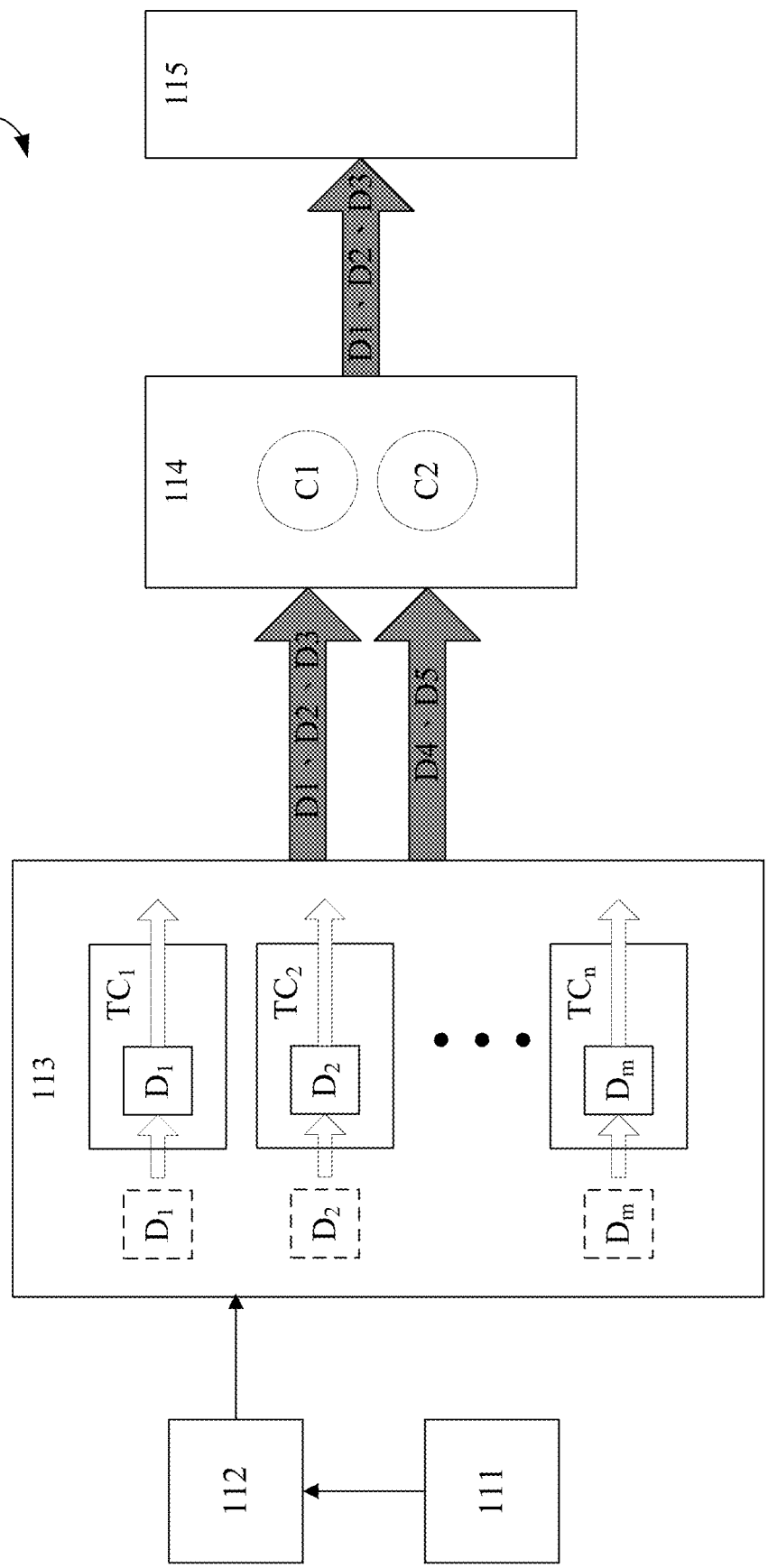
FIG. 2 depicts a schematic view of the mode of operation of the loading-and-unloading equipment according to one or more embodiments of the present disclosure.

FIG. 2 depicts a schematic view of an automatic test system according to one or more other embodiments of the present disclosure. The contents shown in FIG. 2 are only for easily illustrating the embodiments, instead of limiting the scope of the present disclosure. Please refer to FIG. 2. The work field F1 of the loading-and-unloading equipment 11 may comprise a plurality of areas, such as an input area 111, a feeding area 112, a loading-and-unloading area 113, a sorting area 114 and an output area 115.

The input area 111 may be arranged for storing untested target devices, and the feeding area 112 may be arranged for placing the target devices $D_1$-$D_m$ ready for test. The loading-and-unloading tools (e.g., robotic arms) of the loading-and-unloading equipment 11 may be configured to move the test carriers $TC_1$-$TC_n$ to the loading-and-unloading area 113, pick up the target devices $D_1$-$D_m$ to be tested from the feeding area 112, and then install/load the target devices $D_1$-$D_m$ to be tested on the corresponding test carriers $TC_1$-$TC_n$ in the loading-and-unloading area 113. In some embodiments, the work field F1 of the loading-and-unloading equipment 11 may require a whole area of about nine (9) square meters (m²) for the input area 111, the feeding area 112, the loading-and-unloading area 113, the sorting area 114, and the output area 115. However, those areas are not limited to this kind of dimensions.

After the target devices $D_1$-$D_m$ to be tested are installed/loaded on the corresponding test carriers $TC_1$-$TC_n$, the loading-and-unloading equipment 11 of the automatic test system 1 may move the test carriers $TC_1$-$TC_n$ carrying the target devices $D_1$-$D_m$ to the test equipment 12 for performing tests directly.

Different from the automatic test system 1, the loading-and-unloading equipment 11 of the automatic test system 2 moves the test carriers $TC_1$-$TC_n$ carrying the target devices $D_1$-$D_m$ to the work field F2 of the test equipment 12 via the transportation equipment 13, such that the test equipment 12 may perform necessary tests accordingly. Specifically, the transportation equipment 13 may obtain the status of the test equipment 12 (e.g., idle/standby, full load, half load, etc.) in real time through the communication between the transportation computer CP3 and the test computer CP2, and may move the test carriers $TC_1$-$TC_n$ carrying the target devices $D_1$-$D_m$ to the working field F2 where the test equipment 12 is located according to the state of the test equipment 12, such that the test equipment 12 may take over the testing of the target devices $D_1$-$D_m$. Similarly, the transportation equipment 13 may obtain the status of the loading-and-unloading equipment 11 (e.g., idle/standby, full load, half load, etc.) in real time through the communication between the transportation computer CP3 and the test computer CP1, and may move the test carriers $TC_1$-$TC_n$ carrying the tested target devices $D_1$-$D_m$ back to the work area F1 of the loading-and-unloading equipment 11 according to the state of the loading-and-unloading equipment 11. Subsequently, the loading-and-unloading equipment 11 may unload the target devices $D_1$-$D_m$ from the test carriers $TC_1$-$TC_n$ in the loading-and-unloading area 113.

The test equipment 12 may transmit the test results of the tested target devices $D_1$-$D_m$ to the loading-and-unloading device 11 through the communication between the loading-and-unloading computer CP1 and the test computer CP2 after the test is completed, so that the loading-and-unloading device 11 may sort the removed/unloaded and tested target devices $D_1$-$D_m$ according to the result of the test (e.g., sorting the target devices $D_1$-$D_m$ into category C1 (e.g., meet the test standard) or category C2 (e.g., not meet the test standard) as shown in FIG. 2), and may place them in the storage space corresponding to each category in the sorting area 114. In some embodiments, for different needs, the categories may be used to represent, for example: pass or fail, multiple levels of thermal resistance, multiple levels of electrical conductivity, etc. Target devices of a specific category in the sorting area 114 (e.g., the target devices $D_1$-$D_3$ belonging to category C1 as shown in FIG. 2) may be provided to the output area 115 for use in other subsequent processes. After sorting and outputting, the next round of loading-and-unloading, testing, and transportation of the target device may begin.

Figure 3:
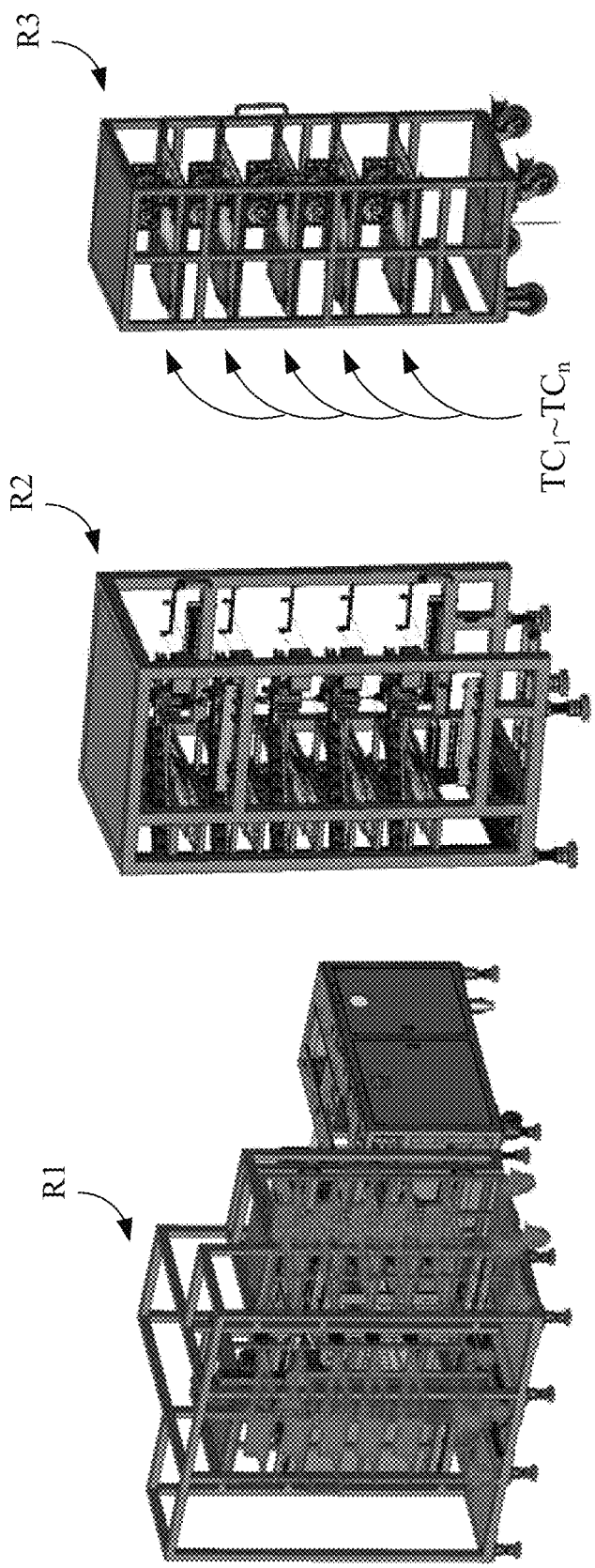
FIG. 3 depicts a schematic view of the structures of the loading-and-unloading equipment, the test equipment and the transportation equipment according to one or more embodiments of the present disclosure.

FIG. 3 depicts a schematic view of the structures of the loading-and-unloading equipment, test equipment and transportation equipment according to one or more embodiments of the present disclosure. The contents shown in FIG. 3 are only for easily illustrating the embodiments, instead of limiting the scope of the present disclosure. Referring to FIG. 3, the transportation equipment 13 may comprise at least one multi-layer transportation rack R3, and each multi-layer transportation rack R3 may accommodate the test carriers $TC_1$-$TC_n$ in layers. The loading-and-unloading equipment 11 may comprise at least one multi-layer loading-and-unloading rack R1, and each multi-layer loading-and-unloading rack R1 may have a space for accommodating one multi-layer transportation rack R3. The test equipment 12 may comprise at least one multi-layer test rack R2, and each multi-layer test rack R2 may also have a space for accommodating a multi-layer transportation rack R3. In some embodiments, the length, width, and height of the multi-layer transportation rack R3 may be, for example, but not limited to, 615 mm, 600 mm, and 1696 mm, respectively; the length, width, and height of the multi-layer test rack R2 may be, for example, but not limited to, 867 mm, 781 mm, and 1765 mm, respectively; and the length, width, and height of the multi-layer loading-and-unloading rack R1 may be, for example, but not limited to, 2892 mm, 2870 mm, and 2200 mm, respectively.

In some embodiments, the multi-layer transportation rack R3 of the transportation equipment 13 may comprise a plurality of fixing elements for respectively fixing the test carriers $TC_1$-$TC_n$ placed on the multi-layer transportation rack R3 to keep the test carriers from falling off the rack. Similarly, the multi-layer loading-and-unloading rack R1 of the loading-and-unloading equipment 11 and the multi-layer test rack R2 of the test equipment 12 may each comprise a plurality of fixing elements for fixing the test carriers $TC_1$-$TC_n$ placed on the multi-layer loading-and-unloading rack R1 and the multi-layer test rack R2. For example, each fixing element may be a bottom plate, a set of sliding rails, a fixing buckle, a fixing hook, an adhesive material, or a combination of the foregoing elements.

The multi-layer transportation rack R3 may be moved between the loading-and-unloading equipment 11 and the test equipment 12 in various ways of transportation, such as but not limited to one of the followings: rail transportation, maglev transportation, pulley transportation, and vehicle transportation. For example, in some embodiments, the multi-layer transportation rack R3 may comprise a plurality of rollers and move between the loading-and-unloading equipment 11 and the test equipment 12 through the rollers. In addition, in some embodiments, a track may also be installed between the loading-and-unloading equipment 11 and the test equipment 12, and the multi-layer transportation rack R3 may run on the track through the plurality of rollers, thereby moving between the test equipment 12 and the loading-and-unloading equipment 11. In some embodiments, the above-mentioned track may be in the form of overhead girders/beams, and in this case, the rollers of the multi-layer transportation rack R3 may not be located at the bottom, but at the top, of the multi-layer transportation rack R3, in which the transportation equipment 13 may be equivalent to comprising a bridge/gantry crane.

In some embodiments, the transportation equipment 13 may also comprise a control circuit and at least one environment sensor based on technologies such as imaging, magnetic, and/or time-of-flight (ToF). The at least one environment sensor may be used to detect the distance between itself and other surrounding facilities, and the control circuit may control the movement of the transportation equipment 13 according to the information collected by the sensor, so as to evade before a collision occurs. Thereby, an automated movement of the transportation equipment 13 between the loading-and-unloading device 11 and the test equipment 12 may be carried out. In this case, the transportation equipment 13 may be equivalent to comprising an automated guided vehicle.

In some other embodiments, the transportation equipment 13 may also carry out the transportation of objects between the test equipment 12 and the loading-and-unloading equipment 11 through ways of transportation such as maglev tracks, conveyor belts, chains, crawler belts, or the like, and multi-layer transportation rack R3, multi-layer test rack R2 and multi-layer loading-and-unloading rack R1 with structures corresponding to the above-mentioned ways of transportation may be adopted accordingly.

The space of the multi-layer test rack R2 may comprise a plurality of test tools corresponding to the test carriers $TC_1$-$TC_n$, and the arranged positions of the test tools may correspond to the arranged positions of the test carriers $TC_1$-$TC_n$ in the multi-layer transportation rack R3, so that the test equipment 12 may directly test the target devices $D_1$-$D_m$ after the multi-layer transportation rack R3 is moved into the accommodating space of the multi-layer test rack R2.

The automatic test system 2 of the present disclosure not only solves the aforementioned technical problem of poor testing efficiency in the art, but also provide the benefit that the work field F1 of the loading-and-unloading equipment 11 or the work field F2 of the test equipment 12 can be expanded independently according to the respective requirements, without affecting the number of equipment and the performance of the other field, since the loading-and-unloading equipment 11 and the test equipment 12 always work in two non-overlapping work fields. In addition, the automatic test system 2 of the present disclosure can fully carry out the concept of an unmanned factory, because of the automated cooperation among the above-mentioned loading-and-unloading equipment 11, test equipment 12, and transportation equipment 13.

Figure 4:
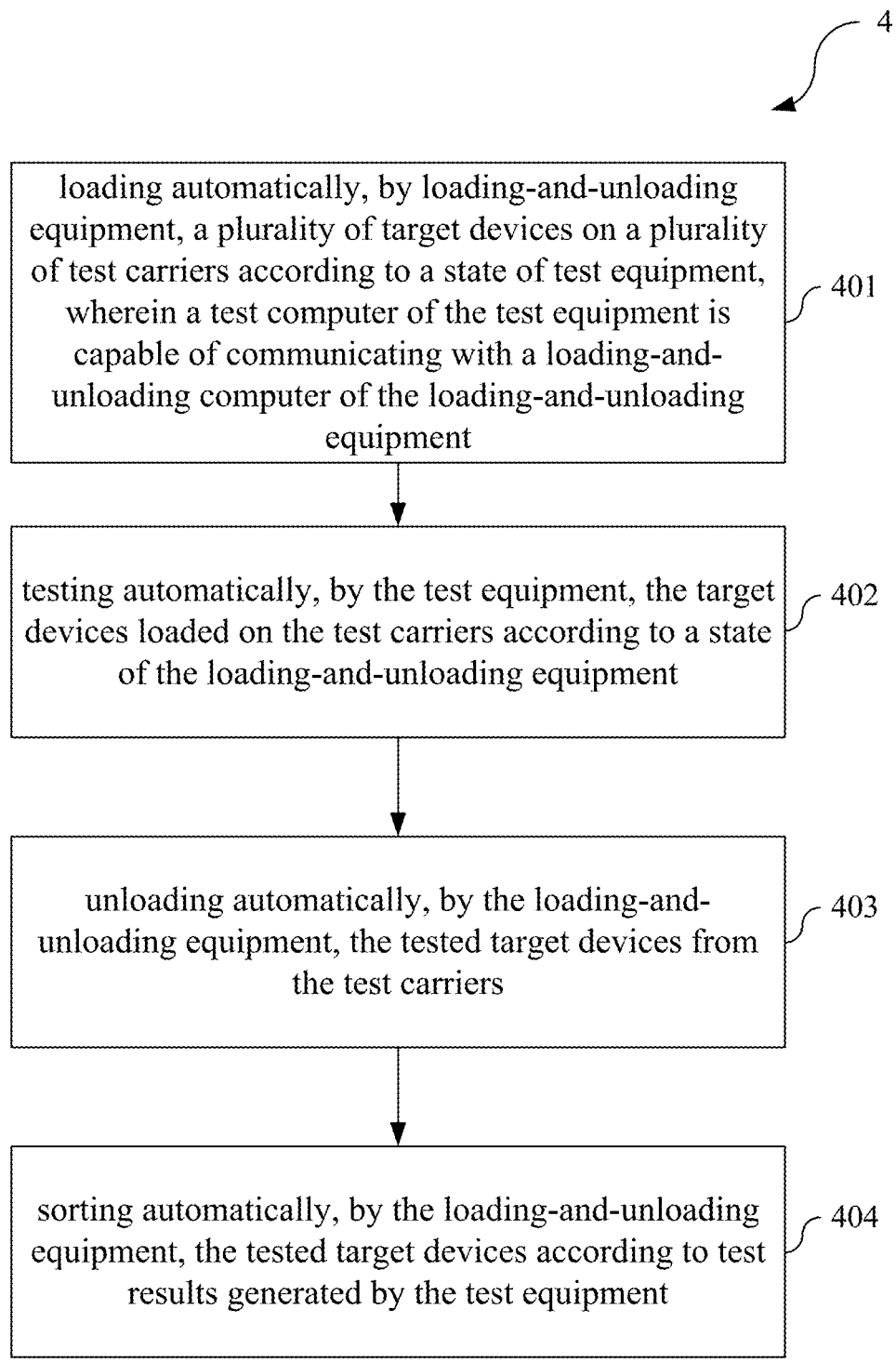
FIG. 4 depicts an automatic test method according to one or more embodiments of the present disclosure.

FIG. 4 depicts an automatic test method according to one or more embodiments of the present disclosure. The contents shown in FIG. 3 are only for easily illustrating the embodiments, instead of limiting the scope of the present disclosure. Referring to FIG. 4, an automatic test method 4 may comprise steps as follows:

loading automatically, by loading-and-unloading equipment, a plurality of target devices on a plurality of test carriers according to a state of test equipment, wherein a test computer of the test equipment is capable of communicating with a loading-and-unloading computer of the loading-and-unloading equipment (marked as 401);

testing automatically, by the test equipment, the target devices loaded on the test carriers according to a state of the loading-and-unloading equipment (marked as 402);

unloading automatically, by the loading-and-unloading equipment, the tested target devices from the test carriers (marked as 403); and sorting automatically, by the loading-and-unloading equipment, the tested target devices according to test results generated by the test equipment (marked as 404).

In some embodiments, the automatic test method 4 may further comprise the steps as follows: transporting, by transportation equipment, the test carriers carrying the target devices to the test equipment according to the state of the test equipment, so that the test equipment tests the target devices, wherein a transportation computer of the transportation equipment is capable communicating with the test computer and the loading-and-unloading computer; and transporting, by the transportation equipment, the test carriers carrying the tested target devices to the loading-and-unloading equipment according to the state of the loading-and-unloading equipment, so that the loading-and-unloading equipment unloads the tested target devices. In addition, in the described embodiment, the transportation equipment may comprise at least one multi-layer transportation rack, and the test carriers may be deployed in the at least one multi-layer transportation rack; the test equipment may comprise at least one multi-layer test rack, and each multi-layer test rack may have a space for accommodating the multi-layer transportation rack; and the loading-and-unloading equipment may comprise at least one multi-layer loading-and-unloading rack, and each multi-layer loading-and-unloading rack may have a space for accommodating the multi-layer transportation rack. Moreover, in the described embodiment, the at least one multi-layer transportation rack may move between the test equipment and the loading-and-unloading equipment in one of the following ways: rail transportation, maglev transportation, pulley transportation, and vehicle transportation.

Each embodiment of the automatic test method 4 basically corresponds to a certain embodiment of the automatic test system 1 or the automatic system 2. Therefore, those of ordinary skill in the art may fully understand and carry out all the corresponding embodiments of the automatic test method 4 simply by referring to the above descriptions of the automatic test system 1 and the automatic system 2, even though not all of the embodiments of the automatic test method 4 are described in detail above.

The above disclosure is related to the detailed technical contents and inventive features thereof. People of ordinary skill in the art may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. An automatic test system, comprising:
test equipment, comprising a test computer;
loading-and-unloading equipment, comprising a loading-and-unloading computer being capable of communicating with the test computer; and
transportation equipment, comprising a transportation computer being capable of communicating with the test computer and the loading-and-unloading computer;
wherein:
    the loading-and-unloading equipment is configured to automatically load a plurality of target devices on a plurality of test carriers according to a state of the test equipment;
    the transportation equipment is configured to transport the plurality of test carriers carrying the plurality of target devices to the test equipment according to the state of the test equipment, so that the test equipment tests the plurality of target devices;
    the test equipment is configured to automatically test the plurality of target devices loaded on the plurality of test carriers according to a state of the loading-and-unloading equipment;
    the transportation equipment is further configured to transport the plurality of test carriers carrying the plurality of target devices after test to the loading-and-unloading equipment according to the state of the loading-and-unloading equipment, so that the loading-and-unloading equipment unloads the plurality of target devices after test from the plurality of test carriers;

the loading-and-unloading equipment is further configured to automatically unload the plurality of target devices after test from the plurality of test carriers; and the loading-and-unloading equipment is further configured to automatically sort the plurality of target devices after test according to test results generated by the test equipment.

2. The automatic test system of claim 1, wherein:

the transportation equipment comprises at least one multi-layer transportation rack, with the plurality of test carriers being deployed in the at least one multi-layer transportation rack;

the test equipment comprises at least one multi-layer test rack, with each multi-layer test rack having a space for accommodating the multi-layer transportation rack; and the loading-and-unloading equipment comprises at least one multi-layer loading-and-unloading rack, with each multi-layer loading-and-unloading rack having a space for accommodating the multi-layer transportation rack.

3. The automatic test system of claim 2, wherein the at least one multi-layer transportation rack moves between the test equipment and the loading-and-unloading equipment in one of the following ways: rail transportation, maglev transportation, pulley transportation, and vehicle transportation.

4. An automatic test method, comprising:

loading automatically, by loading-and-unloading equipment, a plurality of target devices on a plurality of test carriers according to a state of test equipment;

transporting, by transportation equipment, the plurality of test carriers carrying the plurality of target devices to the test equipment according to the state of the test equipment, so that the test equipment tests the plurality of target devices;

testing automatically, by the test equipment, the plurality of target devices loaded on the plurality of test carriers according to a state of the loading-and-unloading equipment;

transporting, by the transportation equipment, the plurality of test carriers carrying the plurality of target devices after test to the loading-and-unloading equipment according to the state of the loading-and-unloading equipment;

unloading automatically, by the loading-and-unloading equipment, the plurality of target devices after test from the plurality of test carriers; and sorting automatically, by the loading-and-unloading equipment, the plurality of target devices after test according to test results generated by the test equipment;

wherein a test computer of the test equipment, a loading-and-unloading computer of the loading-and-unloading equipment, and a transportation computer of the transportation equipment are capable of communicating with each other.

5. The automatic test method of claim 4, wherein:

the transportation equipment comprises at least one multi-layer transportation rack, with the plurality of test carriers being deployed in the at least one multi-layer transportation rack;

the test equipment comprises at least one multi-layer test rack, with each multi-layer test rack having a space for accommodating the multi-layer transportation rack; and the loading-and-unloading equipment comprises at least one multi-layer loading-and-unloading rack, with each multi-layer loading-and-unloading rack having a space for accommodating the multi-layer transportation rack.

6. The automatic test method of claim 5, wherein the at least one multi-layer transportation rack moves between the test equipment and the loading-and-unloading equipment in one of the following ways: rail transportation, maglev transportation, pulley transportation, and vehicle transportation.

* * * * *